United States Patent [19]

Goodman et al.

[11] 4,190,809
[45] Feb. 26, 1980

[54] STRIPE LASERS

[75] Inventors: Colin H. L. Goodman, Loughton; Paul A. Kirkby, Harlow, both of England

[73] Assignee: International Standard Electric Corporation, New York, N.Y.

[21] Appl. No.: 840,468

[22] Filed: Oct. 7, 1977

[30] Foreign Application Priority Data

Oct. 13, 1976 [GB] United Kingdom ............... 42611/76

[51] Int. Cl.² ............................................... H01S 3/19
[52] U.S. Cl. .................................. 331/94.5 H; 357/18
[58] Field of Search ..................... 331/94.5 H; 357/17, 357/18

[56] References Cited

U.S. PATENT DOCUMENTS 3,701,044  10/1972  Paoli et al. ..................... 331/94.5 H
3,982,261  9/1976   Antypas ....................... 331/94.5 H X
3,983,510  9/1976   Mayashi et al. ................. 331/94.5 H

OTHER PUBLICATIONS

M. B. Panish, "Heterostructure Injection Lasers", *Bell Laboratories Record*, Nov. 1971, pp. 299-304.

*Primary Examiner*—James W. Davie
*Attorney, Agent, or Firm*—John T. O'Halloran; Alfred C. Hill

[57] ABSTRACT

An injection laser in which the current flow across the active layer of the device is restricted by confining the current flow across an adjacent interface to a pair of closely spaced parallel stripes. The width and spacing of these stripes is chosen to promote the waveguiding of the zero order mode of the laser in preference to the waveguiding of the first order mode and to waveguiding by the so called "gain guiding" mechanism.

8 Claims, 7 Drawing Figures

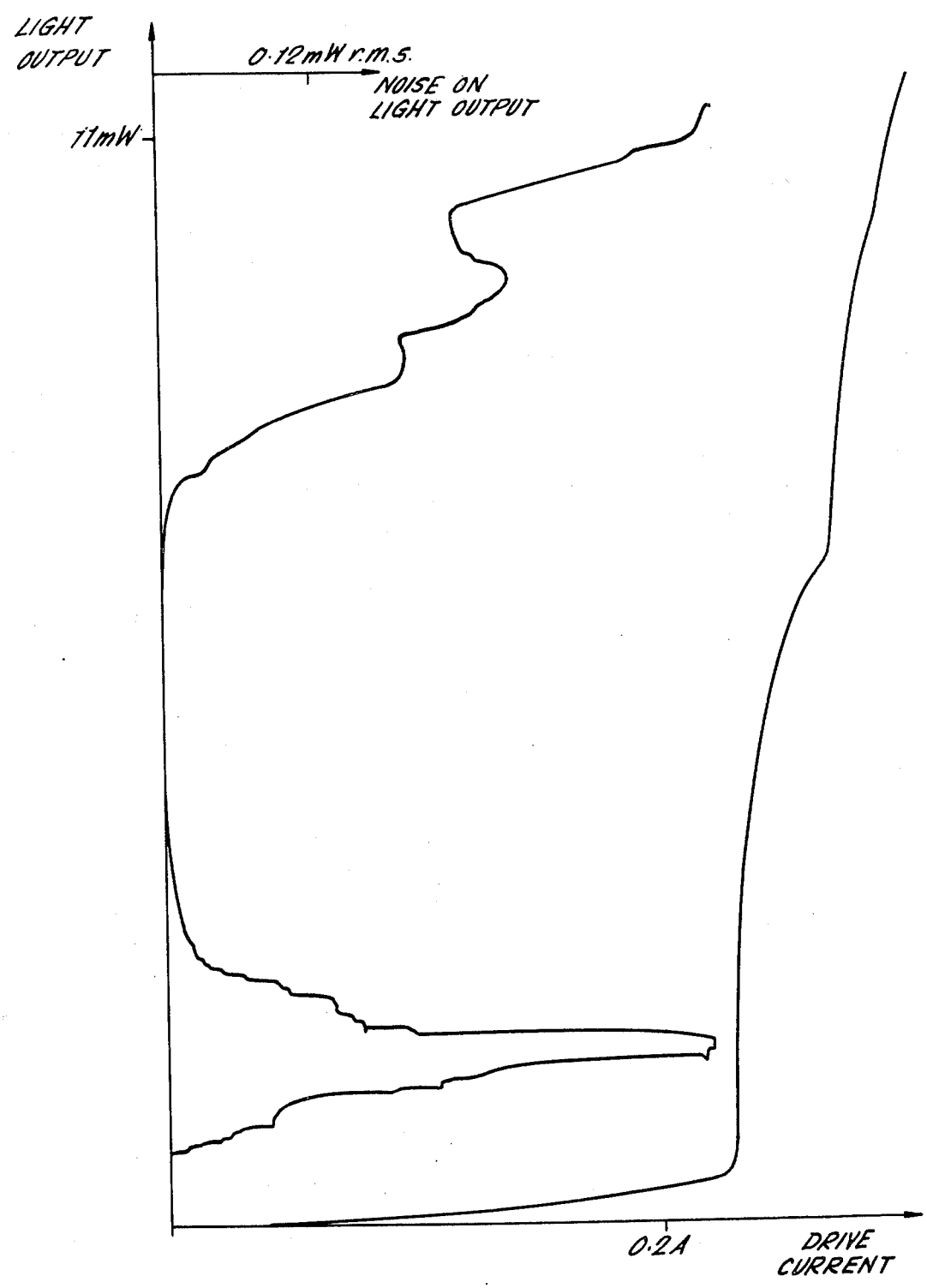

STRIPE LASERS

BACKGROUND OF THE INVENTION

This invention relates to stripe lasers.

According to the present invention there is provided an injection laser in which current flow across the active layer is restricted by confining the current flow across an adjacent interface, wherein the current across said interface is confined to a pair of closely spaced parallel stripes dimensioned and spaced so as to promote the waveguiding of the zero order mode of the laser in preference to the waveguiding of the first order mode and waveguiding by the so called "gain guiding" mechanism. The interface may be that between a top electrical contact layer and underlying epitaxially grown semiconductive material. Alternatively it may be between a semiconductive substrate and epitaxially grown semiconductive material underlying the active layer.

The invention also provides a method of making an injection laser including the step of providing the laser with an interface adjacent the active layer across which interface the current flow is confined to two parallel stripes dimensioned and spaced so as to promote the real dielectric waveguiding of the zero order mode of the laser in preference to either gain-guiding or to the waveguiding of the first order mode.

This twin stripe arrangement produces a carrier density distribution that is more suited to optical guiding than that produced by the single strip of a conventional stripe laser. This, in turn, reduces the recurrent problem in conventional stripe lasers of optical instability which causes non-linear light/current characteristics and excess noise.

In the following description a heterostructure $Ga_{(1-x)}Al_{(x)}As$ ($x \geq 0$) stripe contact laser constructed in accordance with the present invention is contrasted with a conventional stripe contact laser.

BRIEF DESCRIPTION OF THE DRAWING

FIGS. 3a and 3b depict the light current and noise characteristics of, respectively fairly linear and very non-linear oxide insulated conventional stripe lasers;

DESCRIPTION OF THE PREFERRED EMBODIMENT

Figure 1:
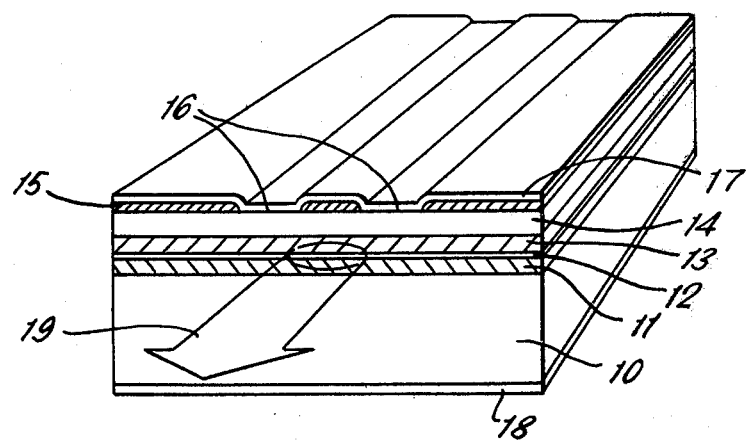
FIG. 1 depicts a schematic perspective view of a stripe contact laser constructed in accordance with the present invention.

Referring to FIG. 1, a heterstructure $Ga_{(1-x)}Al_xAs$ ($x \geq 0$) laser consists of a substrate 10 of GaAs upon which a set of layers 11 to 14 are epitaxially grown to provide a conventional heterostructure laser structure. The particular structure is a double heterostructure laser in which the active layer, layer 12, is sandwiched between two layers 11 and 13 of higher band-gap, lower refractive index material to provide optical and carrier confinement in a direction normal to the plane of the layers. Layers 11 and 13 are of opposite conductivity type, and layer 13 is covered with a further layer, layer 24, made of GaAs in order to facilitate making electrical contact with the top surface of the structure.

Thus far the structure is the same as for a conventional double heterostructure stripe contact laser, and may, if desired, be replaced with a single heterostructure device or a multi-layer heterostructure device having a localized gain region as described, for instance, in Great Britain Pat. No. 1,263,835 of G. H. B. Thompson or the corresponding U.S. Pat. No. 3,911,376, issued Oct. 7, 1975.

Next the structure is provided with an oxide insulating layer 15 covering the whole surface of layer 14 except for two closely spaced parallel stripes 16. This oxide layer is covered with a metal contact layer 17 which forms the top contact by making electrical contact with the underlying semiconductive material along the two exposed stripes. A metal contact layer 18 on the under surface of the substrate 10 provides the counter-electrode contact. The light output is in the direction indicated generally by the arrow 19. A conventional double heterostructure laser typically has the same structure with the difference that there is only one stripe along which the top contact makes contact with the underlying semiconductive material. Typically this single stripe is about 20 μm wide. The carrier density distribution of such a laser is found experimentally to be approximately as illustrated in FIG. 1. At or below the lasing threshold the distribution is as shown in curve a with the highest carrier density beneath the center of the stripe. The optical distribution above threshold is less than 10 μm wide. As the light intensity increases carriers recombine relatively more rapidly in the regions of highest optical intensity thus tending to clamp the carrier density in the region beneath the center of the stripe. The carrier density, however, continues to rise outside the lasing region producing carrier profiles as shown in curve b at 7.5 mW and c curve at 15 mW.

This rapidly changing carrier density distribution is undesirable because it is this carrier density distribution which controls the transverse optical power distribution and the losses of the optical wave as it propagates beneath the stripe. The optical distribution is determined by the real and imaginary parts of the dielectric constant (refractive index ½). The imaginary part of the dielectric constant describes the gain or loss or the medium, and the optical gain of course increases as the carrier density increases. Over a small range of carrier density the gain c an be expressed as $g = \beta n - n_o$, where $\beta$ and $n_o$ are parameters which depend on the wavelength concerned and the temperature. A negative value of g corresponds to loss.

The gain profile, therefore, has approximately the same shape as the carrier density profile with the zero gain axis offset to the carrier density $n_o$. The real part of the dielectric constant is also dependent on the carrier density with the dielectric constant reducing as the carrier density increases. Again for small variation of n the relationship is given by $E = E_1 - \alpha n$, where the $E_1$ is the effective dielectric constant of the active layer waveguide (about 13.8) and $\alpha$ is a proportionality constant again dependent on wavelength. $\alpha$ is very small, with variations of dielectric constant of only $5 - 25 \times 10^{-3}$ being observed across the optical output region of typical lasers. This corresponds to carrier variations in the range $2 - 5 \times 10^{17}$ cm$^{-3}$. These small variations in dielectric constant are, however, very important in determining the optical distribution.

At threshold, therefore, although the gain is greatest beneath the center of the stripe, the dielectric constant is lowest in this region. This concave dielectric constant profile produces an anti-waveguiding effect which is only overcome when the gain is sufficiently high to produce the phenomenon known as 'gain guiding'.

Figure 2:
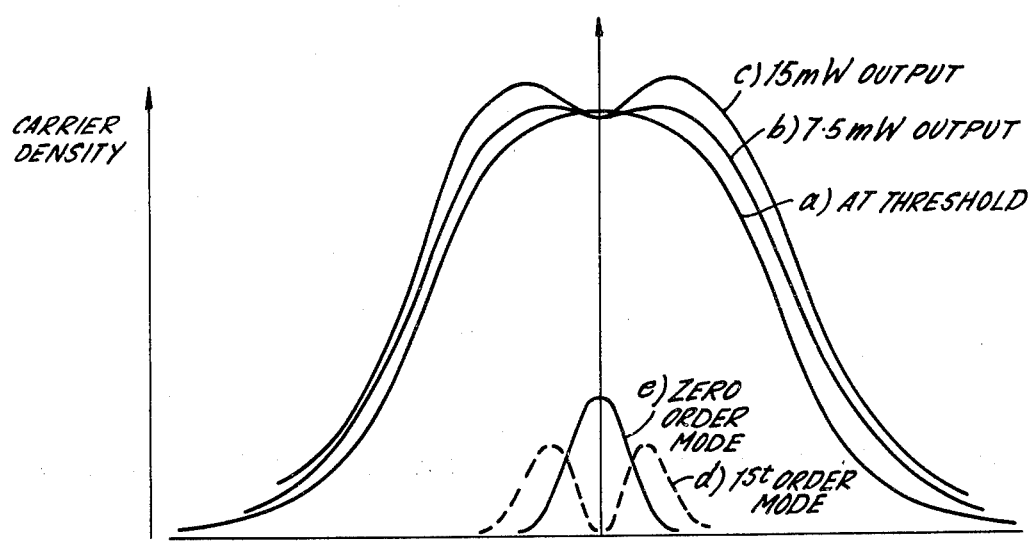
FIG. 2 depicts carrier density and light output profiles for a conventional stripe contact laser.

In this 'gain guiding' situation, light propagating under the stripe is divergent, but the beam width is limited by the absorption of the regions flanking that beneath the stripe. In the direction of the stripe the loss due to beam divergence is offset by the gain of the region under the stripe so that light is able to propagate under the stripe in the direction of the stripe with a net gain. Then, as the current drive increases well above threshold, the optical intensity in the 'gain-guiding' region increases to the extent that the associated carrier depletion produces a dip at the middle of the convex carrier profile thereby producing an inverted 'W' shaped dielectric constant profile which is convex in the middle. Over this convex central region real dielectric waveguiding occurs with the light constantly being focussed along the axis of the stripe. The gain is of course higher at the edges of the optical distribution than in the middle. At sufficiently high output such a wide and deep dielectric profile is produced that the first order mode d is guided and comes into operation competing with the zero order mode e. (FIG. 2).

Figure 3A:
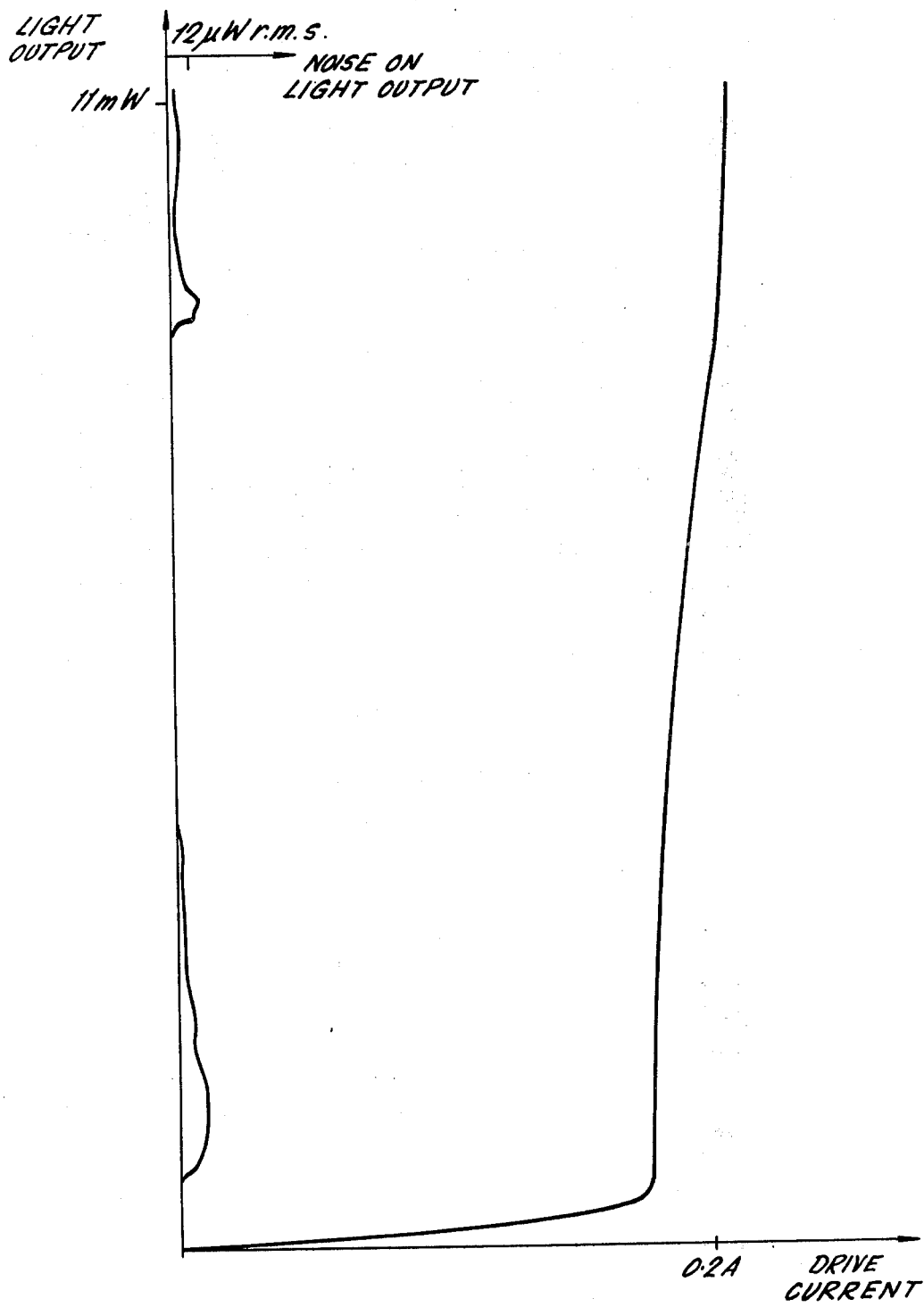

These changes in the optical waveguide parameters, particularly the changes from the lossy 'gain guiding' situation to the self focussed real dielectric waveguide situation, change the operating characteristics of the laser, and are believed responsible for producing the non-linearities in the light current characteristics, such as illustrated in the light/current curves shown in FIGS. 3a and 3b, which relate, respectively, to a fairly linear and a very non-linear oxide insulated conventional stripe laser. The non-linearity of the light/current characteristic above threshold can be seen in both lasers, although the laser of FIG. 3b, shows much larger non-linearities than that of FIG. 3a. The linearity varies greatly from laser to laser, and from wafer to wafer, probably because of the extreme sensitivity of the 'gain guided' wave to small undulations in active layer thickness. We have found that the noise, which is the unwanted random a.c. component in the light output, appears to be closely related to the non-linearity of the laser, with high levels of excess noise associated with the unstable regions of anomalously high slope efficiency. In extreme cases self pulsing occurs. This is the cause of the very high a.c. output that occurs at high output level in the laser illustrated in FIG. 3b.

These non-linearities and the associated instability and noise are a significant deficiency in the operating characteristics of c.w. lasers. Measurements on lasers with deliberate dielectric waveguiding in the plane of the junction show that improved linearity of output characteristics can be obtained. For example, the channelled substrate laser, described in the specification accompanying the Great Britain Patent Application No. 52490/75 of P. A. Kirby, which has a strong waveguide in the plane of the junction, has linear light current characteristics and low noise. The twin stripe laser of the present invention is an alternative method for producing transverse dielectric waveguides in the plane of the junction. It has the advantage that the perturbations in dielectric constant are very small so that a wide zero order mode distribution can be guided.

Figure 4:
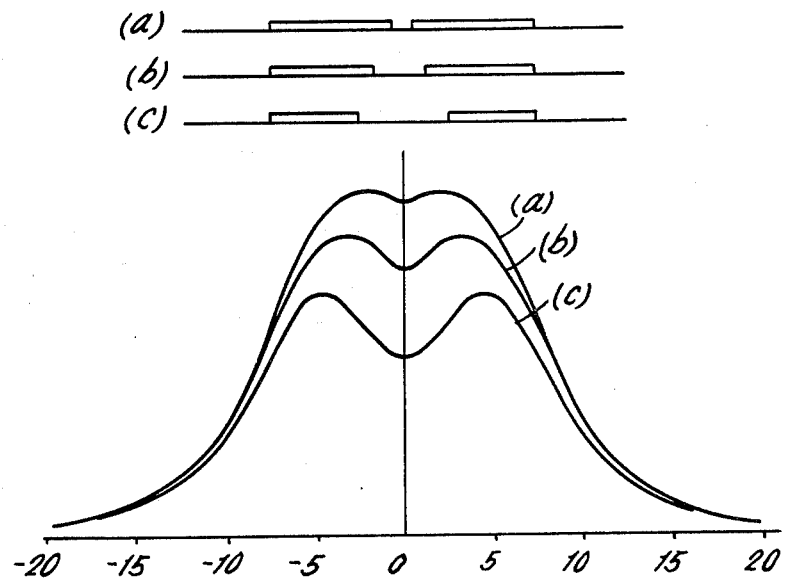
FIGS. 4 and 5 depict the carrier density distribution of the laser of FIG. 1 for various widths and separations of the stripes.
Figure 5:
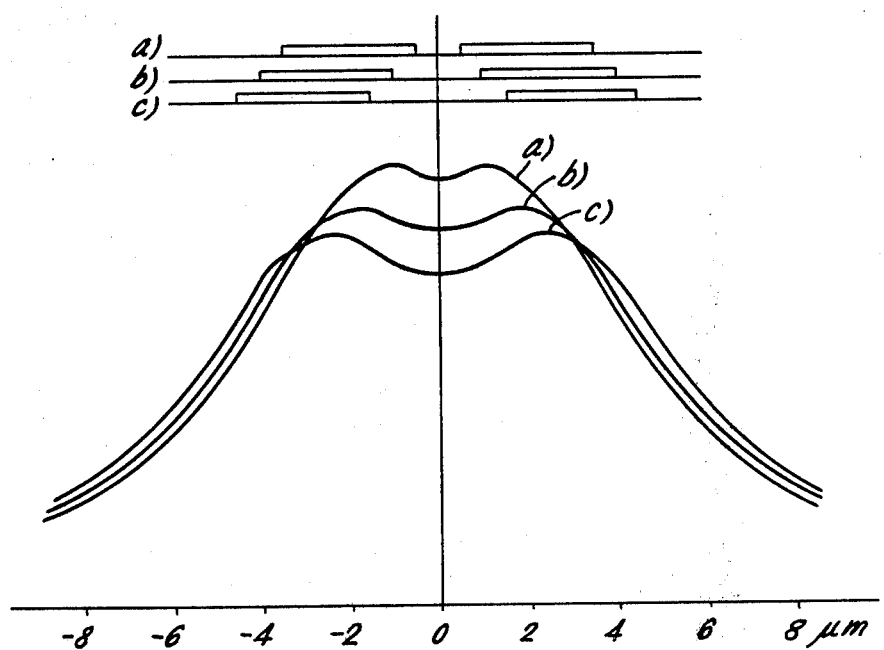

Calculated carrier density profiles beneath the contacts of a variety of twin stripe lasers are illustrated in FIGS. 4 and 5. FIG. 4 shows the profile beneath a twin stripe contact of total width 15 $\mu$m, for the separation between the stripes of 1, 2.5 and 5 $\mu$m. FIG. 5 shows the profile for twin stripes each 3 $\mu$m wide separated by 1, 2 and 3 $\mu$m. These curves are all calculated on the basis of the effective lateral diffusion length being 4 $\mu$m. The actual value will vary with such parameters as active layer doping level, thickness, etc. However, it can be seen that by controlling the width separating the stripes a dip can be formed in the carrier density profile. The depth and width of this dip can be controlled over a wide range by controlling the stripe separation (and the total width). The dip in the carrier density will produce a real dielectric waveguide at all currents both below and above threshold. This will eliminate the deleterious change from 'gain guiding' to dielectric waveguiding, which occurs in the 20 $\mu$m wide single stripes of conventional stripe contact lasers, improving the stability and linearity.

Figure 6:
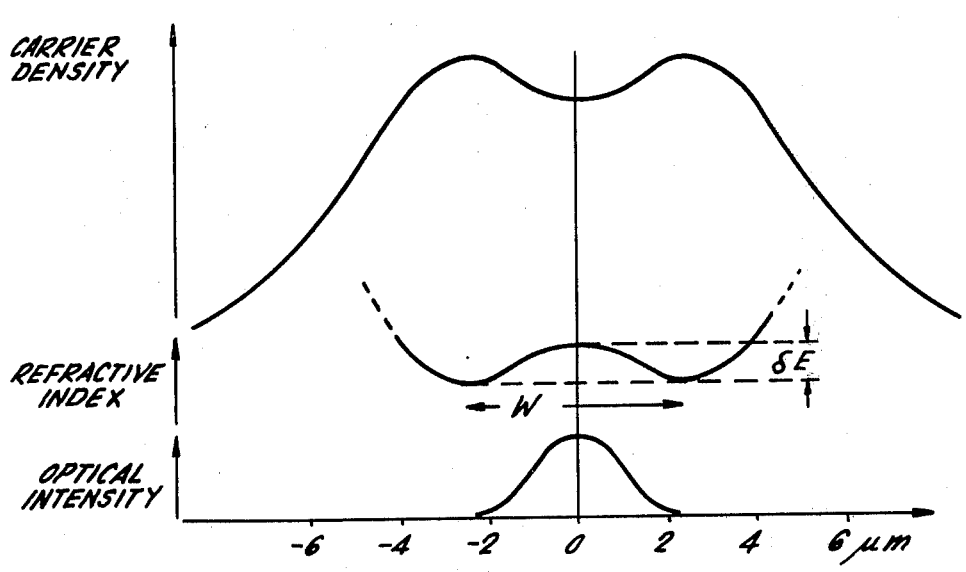
FIG. 6 depicts the carrier density, refractive index, and optical intensity profiles of the laser of FIG. 1 at a particular drive level.

In practice, the total width of the stripes, and the width separating them, will have to be optimized to produce the correct strength of waveguide to guide the zero order mode rather than the first order mode, not only at threshold, but up to high output power. Referring to FIG. 6 the strength of the waveguide is given by $D = \beta_o(\delta\epsilon)^{\frac{1}{2}} W/2$, where $\beta_o$ is the free space propagation constant, $\delta\epsilon$ is the difference in the real part of the dielectric constant between the center and the edges of the waveguide and W is the width of the waveguide. For a parabolic profile similar to the plotted profiles, the zero order mode is completely guided when $D = 1$, and the first order mode comes into operation when $D = 3$. So D can vary over a range of 3:1 with satisfactory waveguiding. The strength of the waveguide is proportional to the width of the waveguide, but only to the square root of the difference in dielectric constant $\delta\epsilon$. Calculations of the shape of the profile as the light intensity increases above threshold show that there is a considerable advantage in reducing the total width of the stripes well below 20 $\mu$m if the onset of the first order mode is to be delayed to as high an output power as possible. On a naive theoretical basis the optimum structure would be two stripes of infinitesimal width separated by the required distance ($\sim 2$–6 $\mu$m). In this structure the width of the waveguide is independent of light output intensity with the peaks in the carrier density profile always occurring beneath the stripes. For stripes of finite width both the width and the depth of the waveguide increase as the light output increases. In practice, optimization has to take accout of the contact resistance of the laser which obviously increases as the total stripe area reduces. A typical structure lies in the range covered by two 3 $\mu$m wide stripes separated by 2–5 $\mu$m and two stripes of total width 15 $\mu$m with a separation of 1–5 $\mu$m. The approximate carrier density profile, refractive index profile and optical intensity distribution for twin stripes 3 $\mu$m wide separated by 3 $\mu$m are illustrated in FIG. 6.

Although the above described example has employed an oxide layer to restrict the current flow across the interface between a top electrical contact and the underlying semiconductive material, it is to be understood that this delineation can be achieved by other means. For instance, it can be achieved by proton-bombardment arranged to render certain areas of the underlying semiconductive material semi-insulating. An alternative method involves the use of zinc diffusion to establish current carrying paths through an n-type isolating layer to p-type material overlying this active layer.

It is also to be understood that instead of arranging for the current confinement to take place at an interface overlying the active layer, it can be confined at an interface underlying the layer. One way of achieving this is to produce a striped substrate type laser. In the case of one example of such a laser grown on an n-type substrate, the substrate has a p-type dopant diffused into its top surface prior to the growth of an n-type epitaxial layer underlying the active layer. This p-type dopant converts the whole of the top of the substrate into p-type material, except for two closely spaced parallel stripes, which are masked from the dopant, and hence remain n-type. Once the mask has been removed, and the epitaxial layer grown, the parts of the substrate which have been converted to p-type material operate to confine the current flow between the substrate and the epitaxial layer to the region of the two stripes.

The optimum spacing of the two stripes is dependent upon the amount of current spreading occurring between the active layer and the interface where the current is confined. In the case of a laser of the structure of FIG. 1, it is the resistivity and thickness of the layers 12, 13 and 14 that are important. The effect of current spreading can be characterized in terms of an effective lateral diffusion length. The following details of measurements concerning the effects of varying the stripe separation relate to a specific double heterostructure construction developed in the first instance for conventional single stripe lasers. In this construction the GaAs substrate 10 (FIG. 1) is 100 $\mu$m thick and is doped with silicon to make it n-type with a nominal carrier concentration of $10^{18}$ carriers cm$^{-3}$. The GaAlAs layer 11 is 3.2 $\mu$m thick, has the composition $Ga_{0.65}Al_{0.35}As$, and is doped with tin to make it n-type with a nominal carrier concentration of $5 \times 10^{17}$ carriers cm$^{-3}$. The active layer 12 is 0.2 $\mu$m thick, has the composition $Ga_{0.95}Al_{0.05}As$, and is doped to give a net nominal carrier concentration of $3 \times 10^{17}$ carriers cm$^{-3}$. The layer 13 is 1.0 $\mu$m thick, has the composition $Ga_{0.62}Al_{0.38}As$, and is doped with germanium to make it p-type with a nominal carrier concentration of $4 \times 10^{17}$ carriers cm$^{-3}$. Finally the GaAs layer 14 is 1.2 $\mu$m thick and is also doped with germanium to make it p-type with a nominal carrier concentration of $4 \times 10^{17}$ carriers cm$^{-3}$. To investigate the effects of varying the stripe separation a number of lasers were made each having the same width of stripe which for the purposes of comparison was set at 2.5 $\mu$m. A typical example of laser with a separation of 2.5 $\mu$m between the adjacent edges of the two stripes shows in its far field pattern that the waveguiding of the structure at threshold is insufficient to properly guide the zero order mode. The leakage of this mode is indicated by the excessive width of the far field pattern. As the lasing threshold the light emission tended to 'snap-on' to about 3 mW, but thereafter the light/current characteristic increased relatively smoothly up to 10 mW light output (limit of test). Another typical laser with a separation of 4.3 $\mu$m between adjacent edges of its stripes was found to guide the zero order mode properly at threshold and the first order mode was not generated until the light output reached about 8 mW. This laser exhibited a smooth progressive light/current characteristic without any significant 'snap-on'. The best example of laser with a 5 $\mu$m separation between adjacent edges of its stripes exhibited the same characteristics as the 4.3 $\mu$m stripe separation laser with the difference that the first order mode was suppressed right up to the limit of testing, namely 10 mW light output. A typical laser with a stripe separation of 5.5 $\mu$m and a laser length of 250 $\mu$m had its lasing threshold at a current drive of 75 mA. Although its light/current characteristic was progressive (smooth), the first order mode became apparent at a current drive of about 90 mA at which time the light output was about 4 mW. It should be noted that the above results pertain to particular examples of laser; the characteristics of nominally identical lasers were found to differ slightly, probably as the result of minor irregularities in the heterojunction surfaces.

The effective lateral diffusion length of current in this structure was measured to be about 3 $\mu$m. The stripe separation would have to be increased for an increased lateral diffusion length.

Although the foregoing specific description has related exclusively to the $Ga_{1-x}Al_xAs$ semiconductor system it is to be understood that the invention is generally applicable to other semiconductor systems, such as, for instance, to $Ga_{1-x}In_xAs_{1-y}P_y$ semiconductor systems.

What is claimed is:
1. An injection laser comprising:
   a first metal contact layer;
   a first semiconductor layer disposed on and coextensive with said first contact layer;
   a second semiconductor layer disposed on and coextensive with said first semiconductor layer;
   an active semiconductor layer disposed on and coextensive with said second semiconductor layer;
   a third semiconductor layer disposed on and coextensive with said active layer;
   a fourth semiconductor layer disposed on and coextensive with said third semiconductor layer;
   an insulating layer disposed on said fourth semiconductor layer to provide a pair of closely spaced parallel stripes on a surface of said fourth semiconductor layer, each of said stripes having a given width and adjacent edges of said stripes being separated from each other by an amount greater than 2.5 $\mu$m and not greater than 5.5 $\mu$m to promote real dielectric waveguiding of the zero order mode of said laser in preference to either gain-guiding or to waveguiding of the first order mode of said laser; and
   a second metal contact layer disposed on and coextensive with said insulating layer and said stripes.
2. A laser according to claim 1, wherein said insulating layer is an oxide layer.
3. A laser according to claim 2, wherein said given width is in the order of 2.5 $\mu$m.
4. A laser according to claim 1, wherein said given width is in the order of 2.5 $\mu$m.
5. A laser according to claim 1, wherein said first, second, third and fourth semiconductor layers, said active layer and said insulating layer are composed of $Ga_{1-x}Al_xAs$, where $x \geq 0$.
6. A laser according to claim 1, wherein said first, second, third and fourth semiconductor layers, said active layer and said insulating layer are composed of $Ga_{1-x}In_xAs_{1-y}P_y$, where $x \geq 0$ and $y \geq 0$.
7. A laser according to claim 2, wherein said first, second, third and fourth semiconductor layers and said active layer are composed of $Ga_{1-x}Al_xAs$, where $x \geq 0$.
8. A laser according to claim 2, wherein said first, second, third and fourth semiconductor layers and said active layer are composed of $Ga_{1-x}In_xAs_{1-y}P_y$, where $x \geq 0$ and $y \geq 0$.

* * * * *